(12) United States Patent
Dawley

(10) Patent No.: US 9,872,396 B2
(45) Date of Patent: Jan. 16, 2018

(54) TIN FUSION JOINING FOR ROBUST INTEGRATION OF ELECTRICAL COMPONENTS WITH AXIAL LEADS

(71) Applicant: GM Global Technology Operations LLC, Detroit, MI (US)

(72) Inventor: Evan J. Dawley, Lake Orion, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 603 days.

(21) Appl. No.: 14/461,583

(22) Filed: Aug. 18, 2014

(65) Prior Publication Data
US 2016/0050767 A1 Feb. 18, 2016

(51) Int. Cl.
| | | |
|---|---|---|
| *H05K 3/30* | (2006.01) | |
| *H05K 3/32* | (2006.01) | |
| *B23K 11/00* | (2006.01) | |
| *B23K 11/11* | (2006.01) | |
| *B23K 11/16* | (2006.01) | |
| *B23K 101/38* | (2006.01) | |

(52) U.S. Cl.
CPC .......... *H05K 3/328* (2013.01); *B23K 11/0026* (2013.01); *B23K 11/11* (2013.01); *B23K 11/166* (2013.01); *B23K 2201/38* (2013.01); *Y10T 29/49139* (2015.01)

(58) Field of Classification Search
CPC ... B23K 11/0026; B23K 11/11; B23K 11/166; B23K 2201/38; H05K 3/328; H01G 9/008; H01R 4/183; Y10T 29/4913; Y10T 29/49139; Y10T 29/49144; Y10T 29/49169; Y10T 29/49179
USPC .......... 29/832, 837, 840, 854, 860; 174/94 R
See application file for complete search history.

(56) References Cited

U.S. PATENT DOCUMENTS

| | | | |
|---|---|---|---|
| 8,163,997 B2 * | 4/2012 | Harazono | H01G 9/008 174/94 R |
| 2010/0018768 A1 * | 1/2010 | Takahashi | H01R 4/183 29/860 |
| 2010/0089641 A1 | 4/2010 | Esmaili et al. | |
| 2010/0277958 A1 | 11/2010 | Campbell et al. | |
| 2010/0302733 A1 | 12/2010 | Woody et al. | |
| 2013/0252052 A1 * | 9/2013 | Dawley | G01R 31/3696 29/623.1 |

\* cited by examiner

*Primary Examiner* — Donghai D Nguyen
(74) *Attorney, Agent, or Firm* — Quinn IP Law

(57) ABSTRACT

A method of joining a first tin-plated electrical component to a second tin-plated electrical component, and components joined to exhibit reduced stress levels at the joined location. The method includes defining a pocket in the second component that is shaped to accept a portion of the first component, placing the portion of the first component substantially within the pocket to define an interfacial region, and using a resistance welder to both form a solid-state diffusion bond along at least a portion of the interfacial region and fill a substantial remainder of the interfacial region with melted tin plating from one or both of the first and second components.

17 Claims, 4 Drawing Sheets

TIN FUSION JOINING FOR ROBUST INTEGRATION OF ELECTRICAL COMPONENTS WITH AXIAL LEADS

BACKGROUND OF THE INVENTION

This invention relates generally to forming a joint between two mating components of an electrical circuit, and more particularly to using resistance welding between one electrical circuit component that includes axial leads to a shaped region of the other component as a way to reduce fracture-inducing stress risers.

Resistance welding (also referred to as electrical resistance welding) uses the electrical resistance of joined materials in conjunction with a high electrical current and high pressure force (both delivered through a pair of opposed electrodes) to maintain the materials together until a coalesced joint forms. Spot welding and seam welding are two well-known examples of resistance welding. Small-scale resistance welders (especially of the spot variety) are particularly well-suited for joining thin components, and as such are conventionally utilized for joining the wire-shaped axial leads of electrical components to flat substrates (examples of which include busbars, traces or terminals).

One common problem with resistance welding is that the high levels of force applied by resistance welder's electrodes to the axial leads tends to produce significant stress risers in the leads as they deform. In fact, such deformation of the lead may be significant, often reducing diameter of the wire by more than 50%. The reduced cross-section can leave a smaller amount of material in the interfacial region to carry the same load, making it susceptible to excessive loads and resultant fracturing during manufacturing processes as well as during the life of the system in which the assembly resides. The likelihood of such excessive stresses and attendant fracturing and premature failure is increased where the lead is exposed to vibratory forces and related fatigue-based dynamics, such as those encountered in automotive and related mobile environments.

The individual cells that make up an automotive battery pack deliver direct current (DC) electricity to various vehicle systems, including motors, electric traction systems (ETS) or the like. Many of these cells (which are incorporated into larger modules, packs or the like) may be electrically joined in series or parallel to achieve a desired level of respective voltage or current needed to power these automotive systems. Such joining takes place via highly conductive busbar or cabling assemblies, and may involve numerous interfacial regions formed between these and other system components.

Much of the joining takes place through resistance welding of small leads that may be exposed to the harsh mechanical and thermal loads associated with an automotive environment; the prolonged vibratory environment attendant to automotive travel is a particularly daunting challenge to the integrity of small leads, which are not robust enough to function as both a mechanical and electrical links between the electrically-joined components. This inability to survive over long-term usage (for example, years or even decades) means there is a significant probability of premature failure at the joined region.

Other joining approaches, such as the flex circuit-based approach and the use of rigid circuit boards, tend to use a large number of joints (in the case of the flex circuit) or bulky, rigid components (in the case of the circuit board); in either event, they involve complex manufacturing techniques, which make them prohibitively expensive, especially in high volume production oriented applications such as automotive battery packs.

As such, there is a need for a manufacturing process that provides greater robustness to joined electrical components, especially as it relates to their fatigue-resistance. There is also a need for joining such components over a wider range of welder-applied forces to allow for greater tolerances in the manufacturing process.

SUMMARY OF THE INVENTION

These needs are met by the present invention, where a tin fusion process minimizes the stresses produced in a weld joint without compromising the electrical integrity of the joint. Significantly, a pocket formed into a stamped lead-receiving component provides for the joining process while limiting the deformation of the axial leads, while the residual tin that forms at the part of the interface not associated with the coalescing solid state diffusion bond fills the voids in the stamped pocket to provide a more spread-out area with which the joint may support mechanical (including vibratory) loads. Thus, by placing the round axial lead of a first electrical component into a pocket formed within a stamped mating second component, at least a portion of the first component can be made to sit below the datum surface of the second component and provide greater contact area. Moreover, when subjected to a resistance welding process, the Joule heat generated by the electrical pulse that passes through the welder's electrodes not only melts the tin plating at the interface between the two components where the diffusion bonding occurs, but realizes a reduced amount of out-of-roundness deformation by virtue of its substantial containment within the pocket of the second component. This in turn reduces the amount of the stress riser created as a result of the resistance welder's applied force. As such, the depth of the pocket is at least a significant contributor to controlling the degree of the stress riser. The presence of the molten tin helps to fuse the component together at the onset of the electrical pulse; moreover, since molten tin is soluble in copper, only a short amount of time (for example, a few milliseconds) is required in order to form a good diffusion bond between the copper core of the joined components.

In accordance with the teachings of the present invention, a method of joining tin-plated axial leads of a first electrical component to a tin-plated second component is disclosed. The method includes defining a pocket shape in the second component to facilitate receiving a portion of the first component therein. From this, that first component portion is placed substantially within the pocket to define an interfacial region between the two components. After that, a solid-state diffusion bond is formed along at least a portion of the interfacial region such that at least some of the tin plating of both the first and second components melts to substantially fill at least some of the interfacial region. Significantly, the forming takes place such that a reduction in a cross-sectional dimension of the first electrical component portion is less than if such forming did not take place in the pocket. In the present context, the first and second electrical components may be the same or different components. In a preferred form, at least one of the electrical components serves an electrically active function (such as a resistor, fuse, capacitor, inductor, voltage source or the like), while at least one of the electrical components serves an electrically passive function (such as a conductor or related conduit for the flow of electric current, of which a busbar, trace, terminal or related metal substrate is an example).

In accordance with another aspect of the present invention, a method of joining a first tin-plated electrical component to a second tin-plated electrical component is disclosed. The method includes defining a pocket in the second component that is shaped to accept a portion of the first component, placing the portion of the first component substantially within the pocket to define an interfacial region and using a resistance welder to both form a solid-state diffusion bond along at least a portion of the interfacial region and fill a substantial remainder of the interfacial region with melted tin plating from one or both of the first and second components.

In accordance with yet another aspect of the present invention, a method of resistance welding a first tin-plated electrical component to a second tin-plated electrical component is disclosed. The method includes placing an electrical lead that extends from the first component substantially within a pocket formed in the second component such that an interfacial region is defined, and using a resistance welder to both form a solid-state diffusion bond along at least a portion of the interfacial region and fill a substantial remainder of the interfacial region with melted tin plating from at least one of the first and second components.

BRIEF DESCRIPTION OF THE DRAWINGS

The following detailed description of specific embodiments can be best understood when read in conjunction with the following drawings, where like structure is indicated with like reference numerals and in which.

DETAILED DESCRIPTION OF THE PREFERRED EMBODIMENTS

Figure 1:
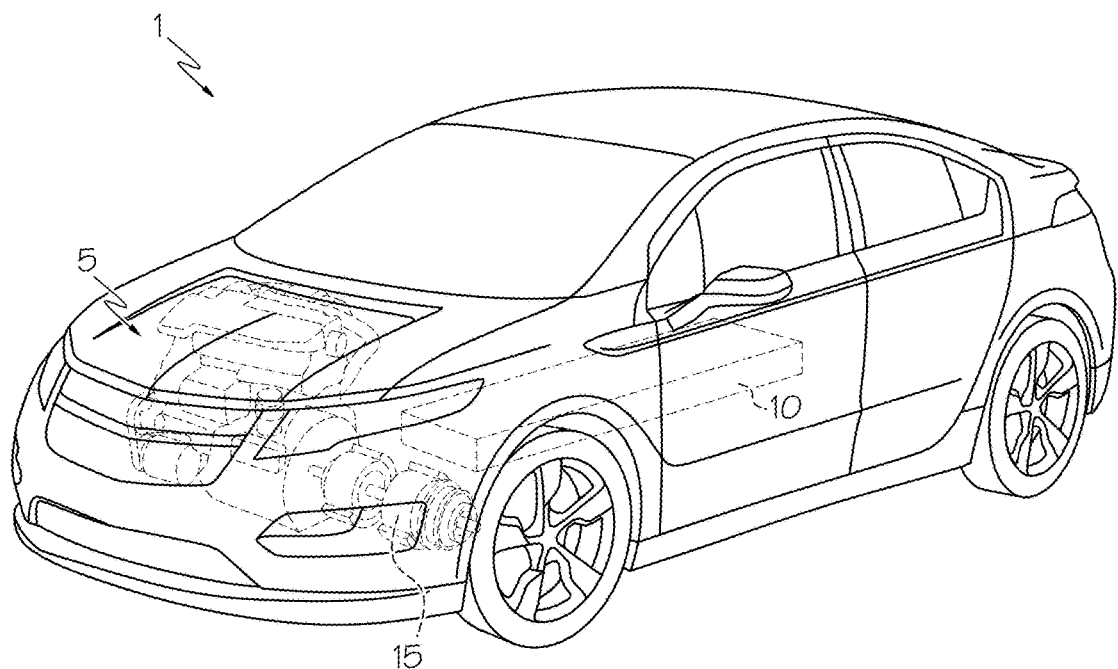
FIG. 1 is a schematic diagram of an exemplary vehicle configured with a hybrid power source, showing the integration of a battery pack with various other subcomponents of the vehicle.

Referring first to FIG. 1, a schematic diagram of a hybrid-powered vehicle 1 in accordance with the present invention is shown. Within the present context, it will be appreciated that the term "vehicle" may apply to car, truck, van sport utility vehicle (SUV) or the like. Vehicle 1 includes (among other components) an internal combustion engine (ICE) 5, battery 10 (also referred to herein as battery pack, module or related to emphasize the assembled nature of multiple battery cells within) and one or more electric motors 15 that are electromechanically cooperative with the ICE 5 and battery 10. Although the battery 10 (which as discussed above may be placed in a frame as part of a larger assembly) is shown in the middle of vehicle 1, it may be located in any suitable location to facilitate suitable vehicular integration. Likewise, the size and number of packs or modules within battery 10 may great greater or fewer, depending on the power needs. In one embodiment, battery 10 is made up of numerous lithium ion (Li-ion) cells (not individually shown). It will be appreciated by those skilled in the art that while vehicle 1 is presently shown as a hybrid-powered vehicle, that one with purely electric power (i.e., one with no need for ICE 5) is also deemed to be within the scope of the present invention.

Figure 2A:
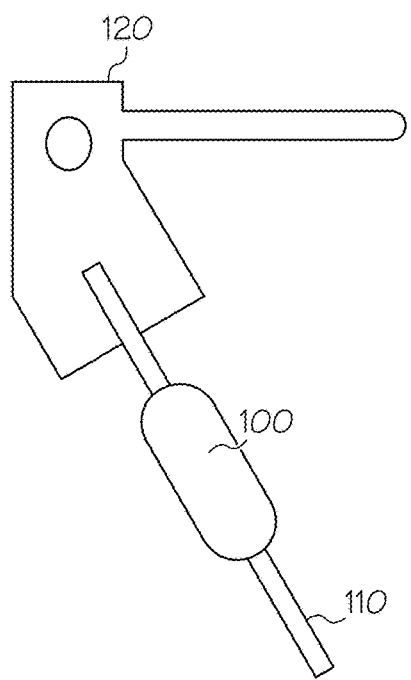
FIG. 2A shows the placement of the leads from a fuse onto a generally planar terminal pin according to the prior art.
Figure 2B:
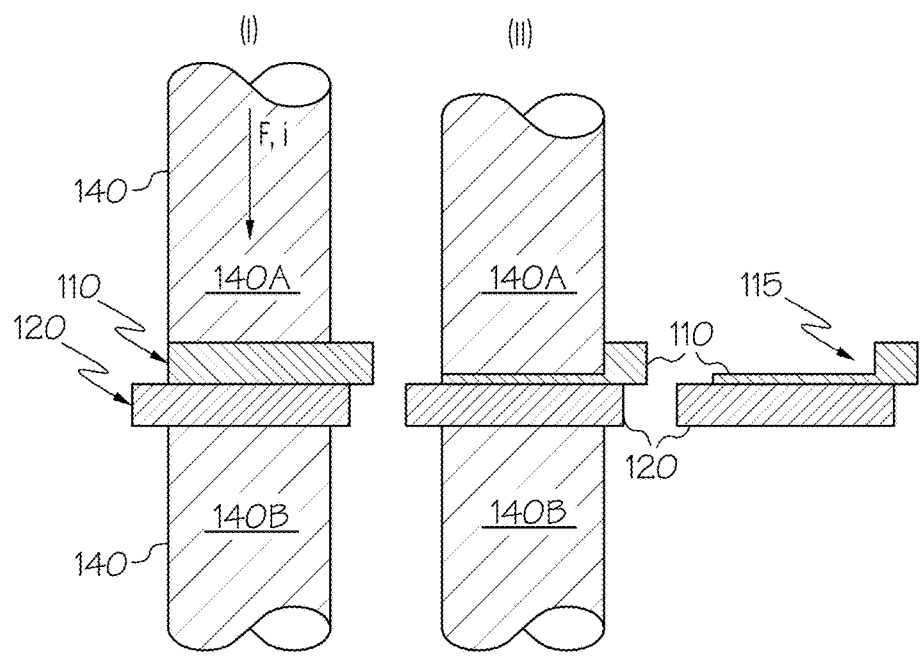
FIG. 2B shows before and after side elevation view representations of the joining of the fuse to the terminal pin of FIG. 2A, as well as resulting reductions in edge cross-section of the resultant weld.

Referring next to FIGS. 2A and 2B, details depicting a portion of a notional prior art joining of a fuse 100 with axial lead 110 and a terminal pin 120 is shown. Referring with particularity to FIG. 2B, when joining these components together with a resistance weld, the combination of applied force from the top and bottom electrode probes (collectively, 140, separately 140A, 140B) high current and limited restraint on the deformation movement of the lead 110 tends to create increased stresses on the lead commensurate with the amount of plastic deformation. In a particular manner, the significant difference in lead 110 thickness (and consequent plastic deformation) of the portion that is subjected to the compressive force of the probes 140 relative to the portion that is not tends to produce tight-radius corners 115 at the edge of the lead 110; such tight corners 115 tend to exhibit significant stress risers that are at an increased risk of fracturing, especially in situations where the welded joint is exposed to vibratory and related fatigue-producing environments.

Referring next to FIGS. 3A through 5, details depicting a portion of a notional joining of a first electrical component (specifically, fuse 200) with axial lead 210 (also referred to herein as electrical lead to emphasize its ability to carry electric current to and from the fuse 200 or other component) and a second electrical component (in the form of a terminal pin 220) according to an embodiment of the present invention is shown. In one form, the various components being joined together by welding make up a voltage-sensing circuit (not shown) such as that discussed in U.S. patent application Ser. No. 14/461,566 entitled INTEGRATION OF A VOLTAGE SENSE TRACE FUSE INTO A BATTERY INTERCONNECT BOARD that is commonly-owned by the Assignee of the present invention and hereby incorporated by reference in its entirety.

Figure 3A:
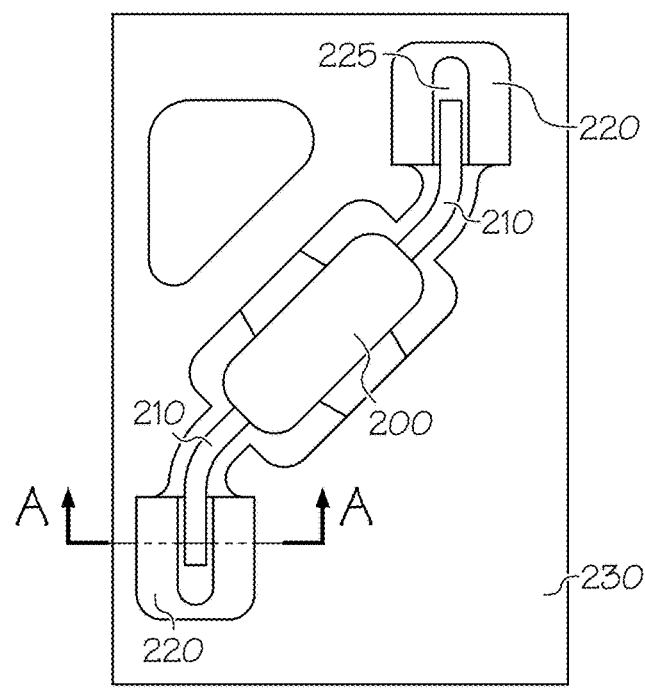
FIG. 3A shows the placement of a fuse with into a pocket-shaped terminal pin according to an aspect of the present invention, where the terminal pin is mounted into a molded housing such that the fuse can be electrically joined to a terminal pin of another electrical component through a trace, busbar or related current-carrying conduit.
Figure 3B:
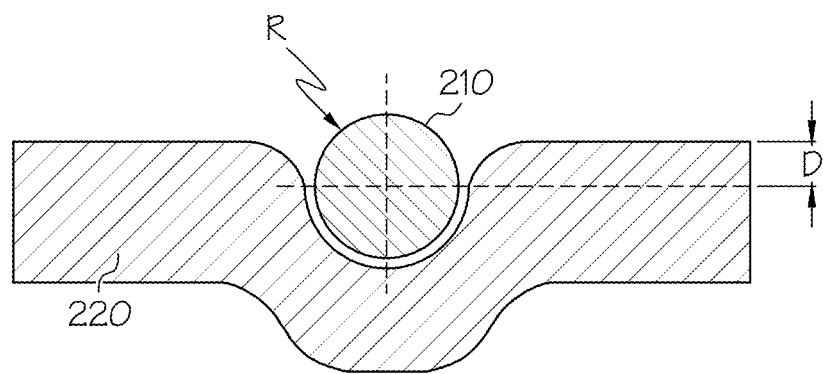
FIG. 3B shows the elevation view along the section line A-A of FIG. 3A, highlighting the cooperation between the pocket and the lead.

Referring with particularity to FIGS. 3A and 3B, fuse 200 is installed such that its generally round axial lead 210 sits in pocket 225 formed in the terminal pin 220 or related mating component (for example, a busbar, trace or the like) that can be placed within a housing 230. In one preferred form, both the fuse lead 210 and at least the pocket 220 are made of copper with tin plating; the tin plating assists in the resistance welding process. Because the tin melts at a lower temperature, it requires less energy than comparable joining techniques (such as welding, where bare copper wires are joined together). The reduced energy level helps prolong the life of the welder electrodes, and additionally minimizes weld process failures such as spattering. In another preferred form, the lead 210 (which acts as a wire-like connector form the electrical function of the fuse 200) has a cylindrical cross-sectional area when viewed axially. The pocket 220 allows the centerline 212 of fuse lead 210 to sit below the datum surface of the mating part (for example, by a pocket depth D as shown in FIG. 3B. In one exemplary form, housing 230 is in the form of an electrically non-conductive interconnect board (ICB) that is sized and shaped to securely receive individual prismatically-shaped cannular battery cells (not shown) that are stacked or aligned along a common axis, and may be placed above or below the aligned cells in order to provide both electrical connectivity and edgewise cell mounting functions. In a more particular form, the housing 230 is a modular assembly, and may include shaped recesses to accept one or more of the fuse 200, axial lead 210, terminal pin 220 (and its pocket 225) via overmolding, snap-fit placement or the like.

As mentioned elsewhere in this disclosure, welded joints formed between the lead 210 and its corresponding pocket 220 may be done through resistance welding. The high compressive loads attendant to resistance welding operation between a generally cylindrical-shaped lead placed in cooperation with a generally planar mating surface can produce significant deformation of the lead, including those where the lead diameter is reduced by 50% or more. This can—if not corrected—undesirably lead to increased incidents of stress-cracking within the welded region. By the present invention, the presence of the pocket 220 acts as a deformation barrier to prevent the relative free-form deformation of a lead that would occur without any buttressing structure. As such, the depth of the pocket 220 controls the magnitude of the axial lead 210 deflection which results from the combined heat and compressive load of the welding process. Thus, for example, in a degenerate pocket configuration (i.e., where the surface onto which the lead is placed is completely planar), the present inventor has noticed reduction R in lead cross-section (in the form of diameter) of 50%. Contrarily, if the pocket depth D is one half the amount of the flat interface reduction R, then there would be 25% reduction in cross-section.

Figure 4A:
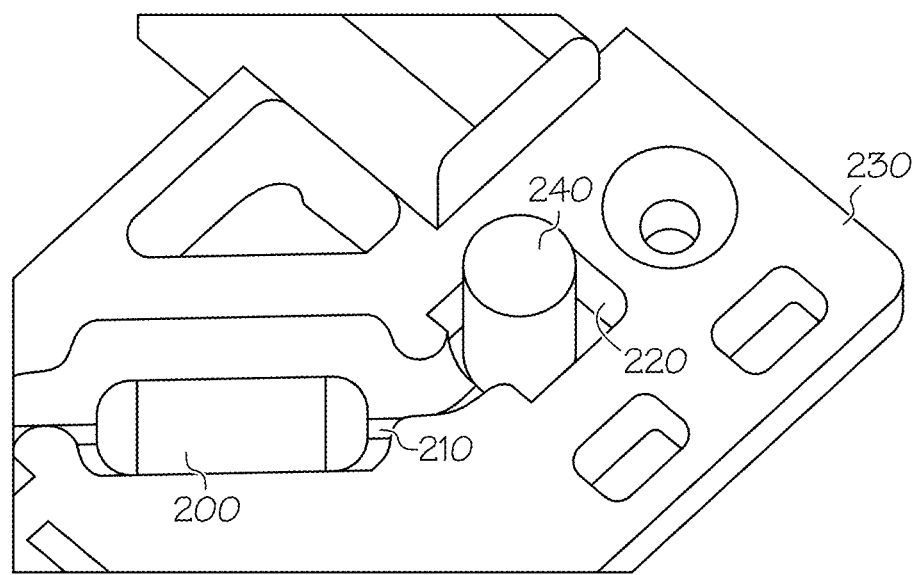
FIG. 4A shows a perspective view of the use of a resistance welding probe to form a weld between the fuse lead and pocket of FIGS. 3A and 3B.
Figure 4B:
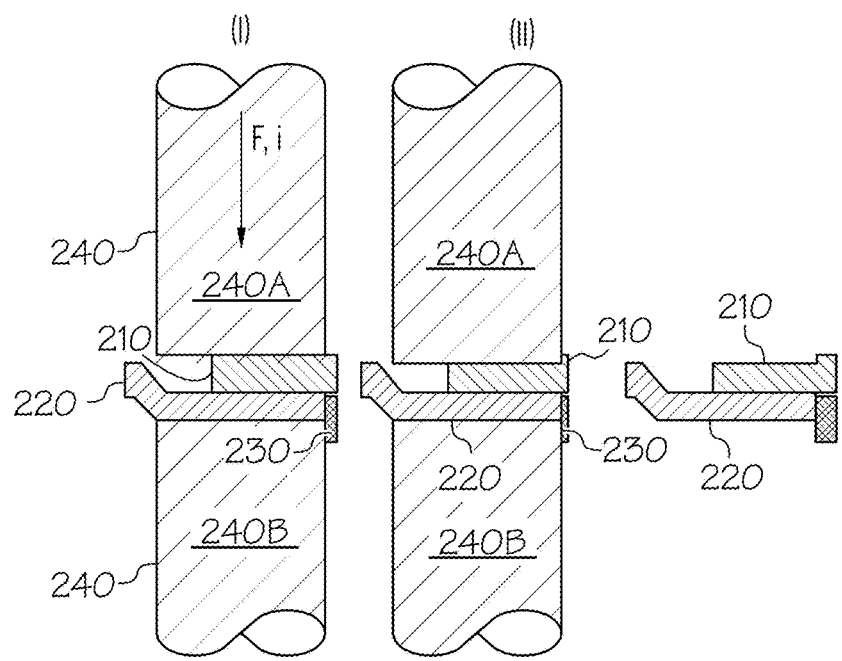
FIG. 4B shows before and after elevation view representations of the joining of the fuse to the terminal pin of FIG. 4A, as well as the preservation of edge cross-section of the resultant weld.
Figure 5:
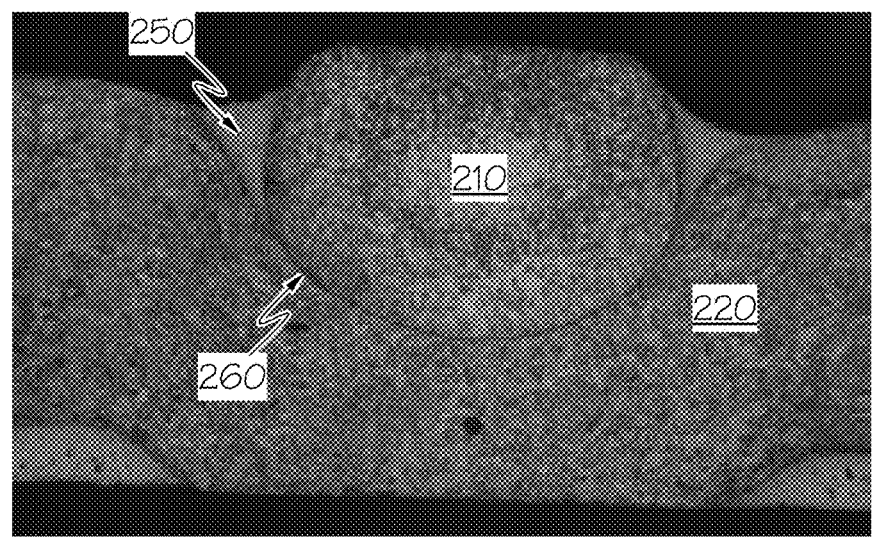
FIG. 5 shows a cutaway magnification of a sample weld produced according to an aspect of the present invention showing a lead with reduced deformation, as well as a robust solid-state diffusion bond formed at the lead-housing interface.

Referring with particularity to FIGS. 4A, 4B and 5, during the tin fusion process of the present invention, the probes 240 (only one of which—the upper one—is shown) of a resistance welder (not shown) apply a compressive force to the joint while a high current pulse is applied. The Joule (i.e., resistive or ohmic) that results from the passage of large amounts of current through the probe 240 melts the tin plating at the interfacial region between lead 210 and pocket 220. In addition, the increased temperature associated with the lead 210 makes it easier to deform the fuse lead 210 such that it is no longer round. Since the fuse lead 210 sits in (and is therefore at least partially supported or reinforced by) the pocket 220, the extensive deformation situation of FIG. 2B that can lead to the stress riser is limited. The molten tin 250 at the interface between the lead 210 and pocket 220 fuses these components together and creates a diffusion bond 260 between the copper core of the fuse lead 210 and the copper core of the pocket 220. The molten tin 250 further fills the remainder of pocket 220 at the weld joint, providing radii typically desired in soldering applications, as shown with particularity in FIG. 5.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Likewise, for the purposes of describing and defining the present invention it is noted that the term "substantially" is utilized herein to represent the inherent degree of uncertainty that may be attributed to any quantitative comparison, value, measurement, or other representation. The term is also utilized herein to represent the degree by which a quantitative representation may vary from a stated reference without resulting in a change in the basic function of the subject matter at issue.

For the purposes of describing and defining the present invention it is noted that the terms "battery", "battery pack" or the like are utilized herein to represent a combination of individual battery cells used to provide electric current, preferably for vehicular, propulsive or related purposes. Furthermore, variations on the terms "automobile", "automotive", "vehicular" or the like are meant to be construed generically unless the context dictates otherwise. As such, reference to an automobile will be understood to cover cars, trucks, buses, motorcycles and other similar modes of transportation unless more particularly recited in context.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:
What is claimed:

1. A method of joining a first tin-plated electrical component to a second tin-plated electrical component, the method comprising:
    defining a pocket in the second component that is shaped to accept a portion of the first component therein;
    placing the portion of the first component substantially within the pocket to define an interfacial region thereby; and
    forming a solid-state diffusion bond along at least a portion of the interfacial region such that at least a portion of the tin plating of both the first and second components melts to substantially fill at least another portion of the interfacial region, the forming taking place such that a reduction in a cross-sectional dimension of the portion of the first electrical component is less than if the forming did not take place in the pocket,
    wherein the reduction in the cross-sectional dimension of the portion of the first electrical component results in a truncated circle having a generally planar surface opposite a generally rounded surface, the generally rounded surface is disposed within the pocket, and the generally planar surface is parallel to an opening of the pocket.

2. The method of claim 1, wherein the portion of the first component comprises an electrical lead.

3. The method of claim 2, wherein the electrical lead defines a substantially cylindrical axial profile and the second component includes a surface thereon, the surface defines the pocket and a plane across the pocket, and the lead defines an axis substantially parallel to the plane.

4. The method of claim 3, wherein the pocket formed in the second component is produced by stamping to define a substantially semi-cylindrical profile.

5. The method of claim 1, wherein the generally planar surface is coplanar with the opening of the pocket.

6. The method of claim 1, wherein the forming comprises using a resistance welder.

7. The method of claim 1, wherein the reduction in the cross-sectional dimension of the portion of the first electrical component results in a truncated circle having a generally planar surface opposite a generally rounded surface, and the reduction in cross-sectional dimension comprises reducing a diameter of the portion by no more than 50%.

8. The method of claim 1, wherein the at least another portion of the interfacial region comprises voids between the lead and the pocket.

9. The method of claim 1, wherein the lead of the first component and the pocket of the second component comprise a copper core underneath the tin plating.

10. The method of claim 1, wherein the first component comprises a fuse and the portion comprises an electrical lead extending from the fuse.

11. A method of joining a first tin-plated electrical component to a second tin-plated electrical component, the method comprising:
   defining a pocket in the second component that is shaped to accept a portion of the first component therein;
   placing the portion of the first component substantially within the pocket to define an interfacial region thereby; and
   using a resistance welder to (a) form a solid-state diffusion bond along at least a portion of the interfacial region and (b) fill a substantial remainder of the interfacial region with melted tin plating from at least one of the first and second components,
   wherein the joining takes place such that a reduction in a cross-sectional dimension of the portion of the first electrical component is less than if the forming did not take place in the pocket, and
   wherein the reduction in the cross-sectional dimension of the portion of the first electrical component results in a truncated circle having a generally planar surface opposite a generally rounded surface, the generally rounded surface is disposed within the pocket, and the generally planar surface is parallel to an opening of the pocket.

12. The method of claim 11, wherein the portion of the first component and the pocket of the second component comprise a copper core underneath the tin plating.

13. The method of claim 11, wherein the first component comprises a fuse, the portion comprises an electrical lead extending from the fuse, the electrical lead defines a substantially cylindrical axial profile, and the portion of the electrical lead is an end of the first component.

14. The method of claim 11, wherein the reduction in cross-sectional dimension comprises reducing a diameter of the portion by no more than 50%.

15. A method of resistance welding a first tin-plated electrical component to a second tin-plated electrical component, the method comprising:
   placing an electrical lead that extends from the first component substantially within a pocket formed in the second component such that an interfacial region is defined thereby; and
   using a resistance welder to (a) form a solid-state diffusion bond along at least a portion of the interfacial region and (b) fill a substantial remainder of the interfacial region with melted tin plating from at least one of the first and second components,
   wherein forming the solid-state diffusion bond provides a reduction in a cross-sectional dimension of the portion of the first electrical component that is less than if the forming did not take place in the pocket, and
   wherein the reduction in the cross-sectional dimension of the portion of the first electrical component results in a truncated circle having a generally planar surface opposite a generally rounded surface, the generally rounded surface is disposed within the pocket, and the generally planar surface is parallel to an opening of the pocket.

16. The method of claim 15, wherein the electrical lead defines a substantially cylindrical axial profile.

17. The method of claim 16, wherein the second component is selected from the group consisting of a bus bar, trace and terminal pin.

* * * * *